(12) United States Patent
Qian et al.

(10) Patent No.: US 11,923,308 B2
(45) Date of Patent: Mar. 5, 2024

(54) DIE INTERCONNECT STRUCTURES HAVING BUMP FIELD AND GROUND PLANE (71) Applicant: Intel Corporation, Santa Clara, CA (US)

(72) Inventors: Zhiguo Qian, Chandler, AZ (US); Kemal Aygun, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 17/114,954

(22) Filed: Dec. 8, 2020

(65) Prior Publication Data
US 2021/0167015 A1 Jun. 3, 2021

Related U.S. Application Data (63) Continuation of application No. 16/336,582, filed as application No. PCT/US2016/054550 on Sep. 29, 2016, now Pat. No. 10,892,225.

(51) Int. Cl.
H01L 23/538 (2006.01)
H01L 23/00 (2006.01)
H01L 23/522 (2006.01)
H01L 23/528 (2006.01)

(52) U.S. Cl.
CPC .......... H01L 23/5383 (2013.01); H01L 23/00 (2013.01); H01L 23/5226 (2013.01); H01L 23/528 (2013.01); H01L 24/14 (2013.01)

(58) Field of Classification Search
CPC ............ H01L 2224/16227; H01L 2924/15192
See application file for complete search history.

(56) References Cited

U.S. PATENT DOCUMENTS

| 6,793,500 | B1* | 9/2004 | Budell | H01L 23/49838 257/E23.079 |
| 6,995,983 | B1* | 2/2006 | Anthony | H05K 1/0243 361/113 |
| 9,209,744 | B1* | 12/2015 | Struble | H03B 5/1231 |
| 10,892,225 | B2 | 1/2021 | Qian et al. | |
| 2005/0218486 | A1* | 10/2005 | Morrison | H01L 23/49838 257/E23.101 |
| 2006/0220227 | A1* | 10/2006 | Marro | H01L 25/0655 257/691 |

(Continued)

FOREIGN PATENT DOCUMENTS

WO WO-2018063261 A1 4/2018

OTHER PUBLICATIONS

"U.S. Appl. No. 16/336,582, Examiner Interview Summary dated Jul. 7, 2020", 3 pgs.

(Continued)

Primary Examiner — Jay C Chang
Assistant Examiner — Mikka Liu
(74) Attorney, Agent, or Firm — Akona IP PC (57) ABSTRACT Generally discussed herein are systems, devices, and methods to reduce crosstalk interference. An interconnect structure can include a first metal layer, a second metal layer, a third metal layer, the first metal layer closer to the first and second dies than the second and third metal layers, the first metal layer including a ground plane within a footprint of a bump field of the interconnect structure and signal traces outside the footprint of the bump field.

20 Claims, 7 Drawing Sheets (56) References Cited

U.S. PATENT DOCUMENTS

| | | |
|---|---|---|
| 2010/0327424 A1 | 12/2010 | Braunisch et al. |
| 2014/0071646 A1 | 3/2014 | Qian et al. |
| 2014/0091474 A1 | 4/2014 | Starkston et al. |
| 2016/0071807 A1 | 3/2016 | Hsu et al. |
| 2016/0183370 A1 | 6/2016 | Rawlings et al. |
| 2016/0197037 A1 | 7/2016 | Starkston et al. |
| 2016/0276307 A1* | 9/2016 | Lin .................. H01L 23/562 |
| 2017/0077022 A1* | 3/2017 | Scanlan ............. H01L 24/19 |
| 2019/0229058 A1 | 7/2019 | Qian et al. |

OTHER PUBLICATIONS

"U.S. Appl. No. 16/336,582, Non Final Office Action dated Apr. 22, 2020", 9 pgs.

"U.S. Appl. No. 16/336,582, Notice of Allowance dated Sep. 8, 2020", 7 pgs.

"U.S. Appl. No. 16/336,582, Preliminary Amendment filed Mar. 26, 2019", 8 pgs.

"U.S. Appl. No. 16/336,582, Response filed Jul. 6, 20 to Non Final Office Action dated Apr. 22, 20", 9 pgs.

"International Application Serial No. PCT/US2016/054550, International Search Report dated Jun. 23, 2017", 3 pgs.

"International Application Serial No. PCT/US2016/054550, Written Opinion dated Jun. 23, 2017", 5 pgs.

* cited by examiner

DIE INTERCONNECT STRUCTURES HAVING BUMP FIELD AND GROUND PLANE

CROSS-REFERENCE TO RELATED APPLICATION

This application is a continuation of U.S. patent application Ser. No. 16/336,582, filed on Mar. 26, 2019, which is a U.S. National Stage Filing under 35 U.S.C. 371 from International Application No. PCT/US2016/054550, filed on Sep. 29, 2016, and published as WO 2018/063261 on Apr. 5, 2018, each of which application is incorporated herein by reference in its entirety.

TECHNICAL FIELD

Embodiments generally relate to packages that can include high density routing in a substrate. Some embodiments can include a device with high density routing structure therein.

TECHNICAL BACKGROUND

Semiconductor devices, such as electronic devices, can include substrate routing that is of a lower density than some of the routing in a chip that is attached to the substrate. Such devices can include complex routing schemes especially in areas where the attached chip includes higher density routing than the routing in the substrate.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Examples in this disclosure relate to devices and systems that include an interconnect structure embedded in a substrate. Examples also relate to techniques of making the systems and devices.

The following description includes terms, such as upper, lower, first, second, etc. that are used for descriptive purposes only and are not to be construed as limiting. The examples of an apparatus, device, or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer and wafers may be made of semiconducting, non-semiconducting, or combinations of semiconducting and non-semiconducting materials.

Current board design can be created by incorporating a number of heterogeneous functions (e.g., dies), such as Computer Processing Unit (CPU) logic, graphics functions, cache memory, and/or other functions to create integrated System on Chip (SoC) designs. Such SoC packages can lower the complexity of a product design and can reduce the number of components required by the product. Picking individual packages that implement these functions and designing the board around the packages chosen can be complex. Using individual packages can increase the system board area, power loss, complexity, component count, and/or costs over an integrated SoC package solution.

The input/output (I/O) density in a package substrate can be a function of a substrate's pad size, trace dimensions, space dimensions, and/or the capability of the manufacturing process. The routing density in a multichip substrate can be several orders of magnitude lower (e.g., about 100 times) than chip level routing density. This routing density can impact cost, size, and performance of a product. The density of interconnects in a chip can include about 300

A way to reduce the size of a product can include using an interconnect structure (e.g., a die that is made using a dual damascene process and is dedicated to providing electrical interconnect paths between dies, such as to allow the dies to communicate) embedded in a substrate (e.g., a bumpless buildup layer (BBUL) or other substrate). Such a solution can allow the interconnect structure to be situated where it would be advantageous to include higher density interconnect routing and allow lower density interconnect routing (e.g., routing with a substrate routing technique) where such lower density routing may be advantageous, such as for routing power or ground lines.

Substrate routing can take up a significant amount of space and can be a factor in the overall size of a die package. By including routing created using typical substrate routing techniques, which generally results in less dense routing than die routing techniques, there may not be enough space to route signals from the die without routing through the die. Integrating the interconnect structure in a package or substrate, such as a BBUL package or substrate, can allow for an increase in overall routing and interconnect density of the package or substrate, thus helping to reduce size and cost.

An interconnect structure (e.g., an embedded multi-die interconnect bridge (EMIB)) is one solution for achieving a dense multichip packaging. It is a technology solution that can help meet high density demand (e.g., greater than 300 (I/O)/mm) of the input/output (I/O) interface between two dies in the same package. However, the data rate of the previous bridge die designs can support is limited to a few Gigabits per second (Gbps) due, at least partially, to a signal integrity issue, such as high crosstalk. This invention discloses embodiments that can include a die design can support more than 10 Gbps. Embodiments discussed herein can improve the bandwidth that the interconnect structure can support, such as by reducing crosstalk.

The crosstalk can be reduced using non-uniform placement of ground bumps, routing layer switching, and/or signal trace offset. Such non-uniform placement can help reduce bump-to-bump crosstalk with more efficient usage of ground bumps. Routing layer switching can help avoid or reduce trace-to-pad crosstalk (e.g., completely avoid trace-to-pad cross-talk). Signal trace offset across layers can help reduce trace-to-trace crosstalk. Embodiments disclosed herein can reduce the crosstalk and help enable a high density, high-speed die-to-die I/O signaling.

Reference will now be made to the drawings wherein like structures will be provided with like suffix reference designations. In order to show the structures of various examples clearly, the drawings included herein are diagrammatic representations of integrated circuit structures. Thus, the actual appearance of the fabricated structures, for example in a photomicrograph, may appear different while still incorporating subject matter of the illustrated examples. Moreover, the drawings show the structures to aid in understanding the illustrated examples.

Figure 1A:
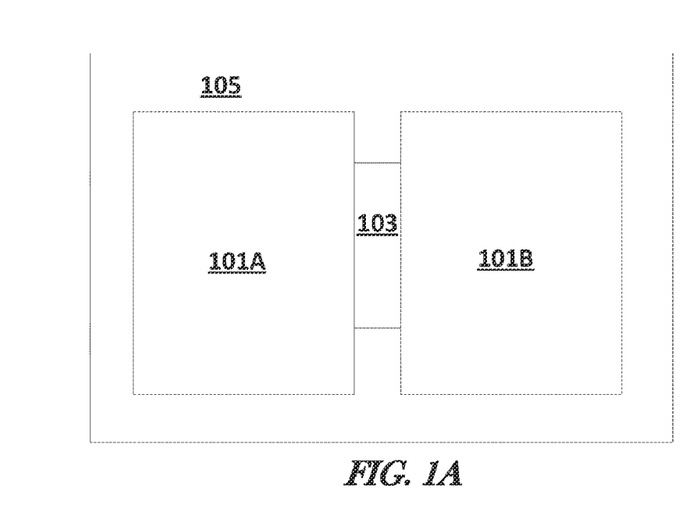
FIG. 1A illustrates, by way of example, a top-view diagram of an embodiment of a system that includes two dies communicatively coupled through an interconnect structure.
Figure 1B:
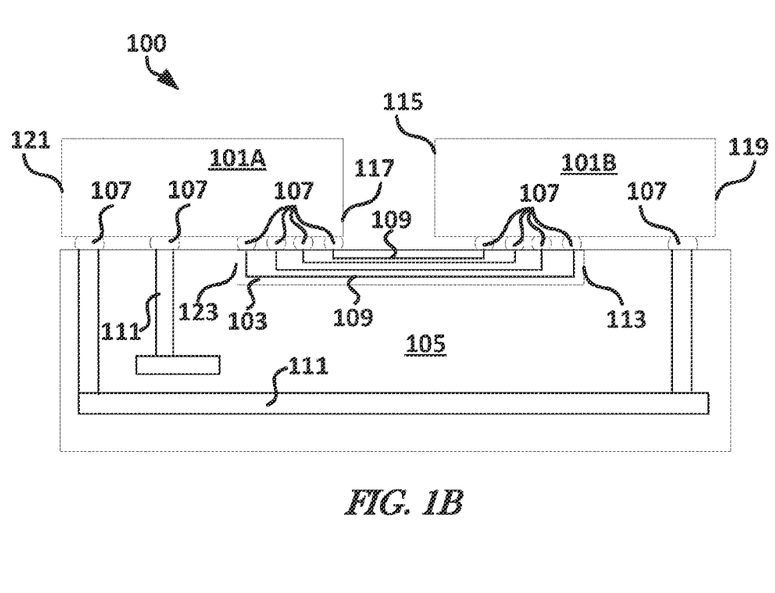
FIG. 1B illustrates, by way of example, a side-view diagram of the system of FIG. 1A.

FIG. 1A illustrates, by way of example, a top-view diagram of an embodiment of a system 100 that includes two dies 101A and 101B communicatively coupled through an interconnect structure 103. FIG. 1B illustrates, by way of example, a side-view diagram of the system 100 illustrated in FIG. 1A. The interconnect structure 103 is at least partially embedded in a substrate 105. The substrate 105 can be a silicon substrate, such as can include a BBUL or organic substrate.

The dies 101A-B can be, respectively, a central processing unit (CPU), graphics processing unit (GPU), field programmable gate array (FPGA), a radio, a transceiver, such as a high-speed transceiver, stacked dynamic random-access memory (DRAM), such as High-Bandwidth Memory (HBM) or wide I/O (WIO), or other die. The dies 101A-B include a first die and a second die each electrically connected to the interconnect structure 103.

The interconnect structure 103 includes electrical interconnects 109 therein and therethrough. Each of the interconnects 109 can include a pad on, or at least partially in, a surface of the interconnect structure 103 (a surface facing an active side of the dies 101A-B). The pads can be electrically connected to each other through one or more vias and one or more traces of the interconnect 109. The interconnect structure 103 can also include one or more planes (e.g., generally planar sections of conductive material), such as ground or power planes.

The interconnect structure 103 can be formed using a dual damascene process. The interconnect structure 103 can be a dedicated routing structure that provides (e.g., only) electrical interconnect pathways through which other dies can communicate. The interconnect structure 103 can, in one or more embodiments, provide no signal manipulation functions and may only transfer a signal from one pad (part of the electrical interconnects 109) to another pad. One die (e.g., 101A) can be electrically connected to one pad on a first end of an electrical interconnect 109 and another die can be electrically connected to another pad on another end of the electrical interconnect 109.

The dies 101A-B can be electrically connected to each other through conductive adhesive 107 and one or more of the electrical interconnects 109. The dies 101A-B can be electrically connected to interconnects 111 in the substrate 105. A density of the interconnects 109 can be greater than a density of the interconnects 111. In one or more embodiments, a density of the interconnects 111 can include about a minimum of nine micrometer interconnect width with about a minimum twelve micrometer space between interconnects. In one or more embodiments, a density of the interconnects 109 can be up to about 300 I/O per millimeter.

Figure 2:
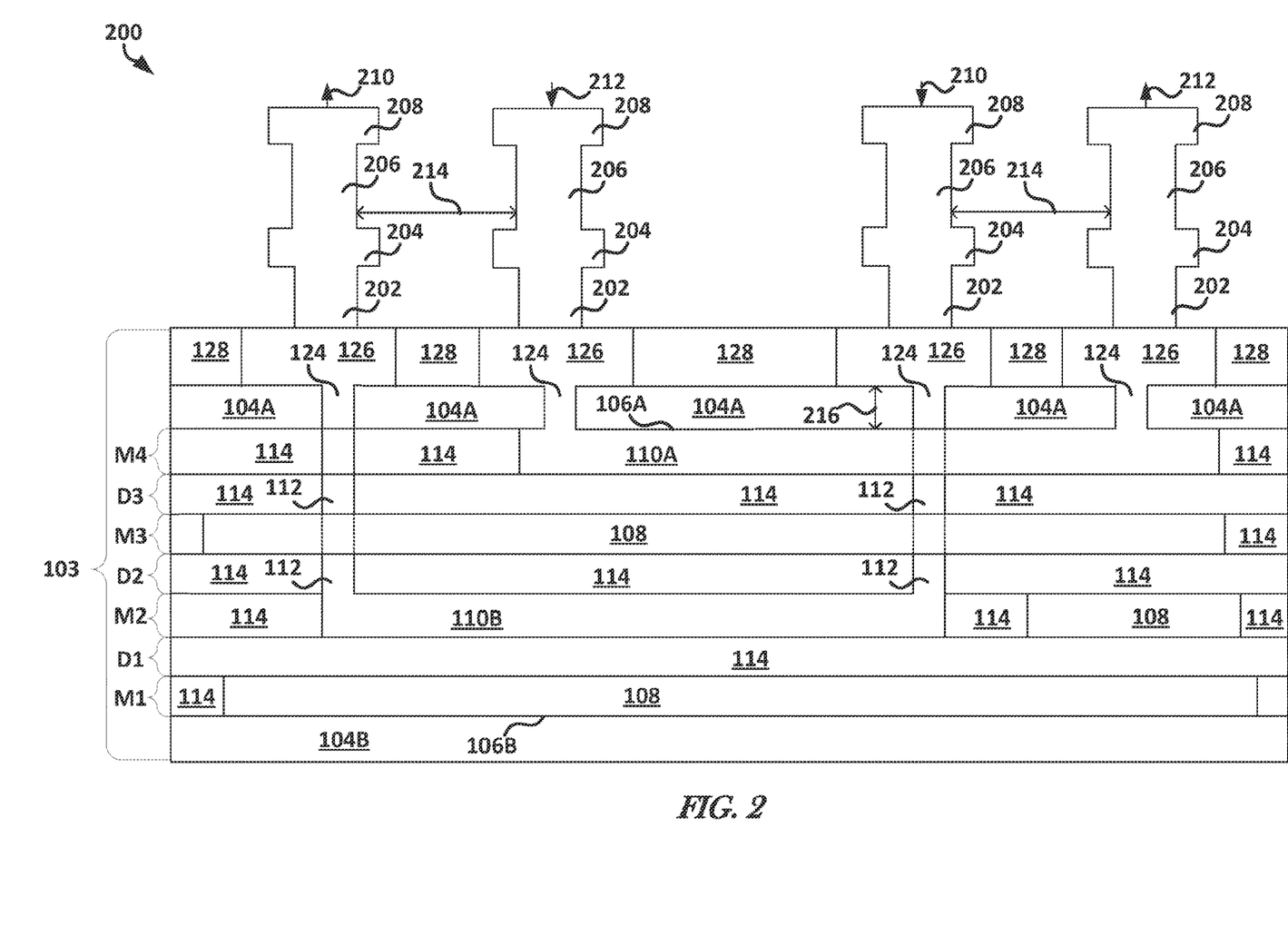
FIG. 2 illustrates, by way of example, a logical exploded cross-section view diagram of a portion of an embodiment of the system illustrated in FIGS. 1A and 1B.

FIG. 2 illustrates, by way of example, an exploded view diagram of a portion of the system 100 including the interconnect structure 103 and electrical interconnects between the interconnect structure 103 and the dies 101A-B. The interconnects between the interconnect structure 103 and the dies 101A-B as illustrated include a package via 202, a pad 204, a pillar 206, and a bump 208.

The interconnect structure 103 as illustrated includes dielectric material 104A and 104B on a respective top surface 106A and bottom surface 106B of a stack that includes alternating metallization layers M1, M2, M3, and M4 and dielectric layers D1, D2, and D3. The M1 and M3 layers, as illustrated, are planes or meshes (e.g., ground planes or ground meshes, such as include planes) and the M2 and M4 layers are signal routing layers, such as include one or more traces.

The dielectric material 104A-B, in one or more embodiments, can include one or more of compounds of silicon or other suitable chemical elements. The dielectric material 104A-B can help provide a hermetic seal for the stack.

The metallization layers M1 and M3 as illustrated include planes or meshes of conductive material 108. The metallization layers M2 and M4 as illustrated include conductive material 110 to provide signal routing. The metallization layers M1-M4 are different from the dielectric layers D1-D3 in that the metallization layers M1-M4 include conductive material formed to be more than just vias. The dielectric layers D1-D3 are composed primarily of dielectric material and can include one or more vias 112. Each of the dielectric layers D1-D3 includes a dielectric material 114. In one or more embodiments, the dielectric material 114 includes silicon dioxide ($SiO_2$), or other dielectric material 114. The dielectric material 114 for D1 can be different from the dielectric material used to create the dielectric layers D2 and/or D3. The conductive material 108, 110, and vias 112 can include conductive metal, such as copper, titanium, aluminum, gold, silver, or a combination thereof, among others. The planes or meshes are different from the traces in that the planes or meshes are wider than the traces and do not carry signal routing, rather the planes or meshes are connected to a power signal (e.g., a supply voltage, ground, or other reference voltage). A trace is generally between about two and twelve micrometers wide and a mesh is generally larger in width.

In one or more embodiments, a thickness of the metallization layers M1-M4 can be about two micrometers (µm). In one or more embodiments, a thickness of the dielectric layers D1-D3 can be about two µm. A thickness of the dielectric material 104A-B can be about two micrometers, in one or more embodiments.

A conductive pad 126 can be formed on a via 124 and the dielectric material 104A. The via 124 extends through the dielectric material 104A. The conductive pad 126 and the via 124 can provide electrical access to signal routing in the stack. The pad 126 can include a dielectric material 128 on sides thereof. The dielectric material 128 can be the same material as the dielectric material 114.

A die 101A (not shown in FIG. 2) can be electrically and mechanically connected to the pad 126 and another die 101B (not shown in FIG. 2) can be electrically and mechanically connected to another pad of the structure 100, such as to electrically connect the two dies through the interconnects 109 of the stack. In such a configuration, signals can be routed to the two dies in a space efficient manner, such as can be greater than two hundred I/O per millimeter per routing layer. The interconnects 109 of FIG. 1 include one or more of the pads 126, vias 124, traces 110A-B, and/or planes 108.

Arrows 210 and 212 indicate a direction of signals in the micro-pillar 206, microbump 208, pad 204, via 202, pad 126, via 124, via 112, and/or trace 110A-B. Cross-talk can occur between signals travelling in same or different directions, such as can include bump-to-bump crosstalk (indicated by arrows 214), trace-to-pad cross-talk (indicated by arrow 216), and trace-to-trace cross-talk (indicated by arrow 218 in FIG. 4).

There are at least two factors that can impact signal integrity of signals travelling through the interconnect structure 103: loss and crosstalk. In order to reduce loss, the I/O bumps 208 can be placed closer to the die edge 115 and 117 (see FIG. 1), so the connecting trace 110A-B can be shorter (as compared to the bump field being closer to the edge 119 and/or 121, respectively). There are three different sources of crosstalk (as previously discussed): bump-to-bump, trace-to-pad, and trace-to-trace. The crosstalk can be reduced by increasing a distance between parts of interconnects 109 carrying different signals.

The bump-to-bump crosstalk is a coupling among the vertical interconnects that include the micro-pillar 206, microbump 208, pad 204, via 202 (indicated by the arrows 214). This crosstalk can include the inductive coupling between the loop current of different signals. Thus, the number and location of ground connected vertical interconnects affects the bump-to-bump crosstalk.

Figure 3:
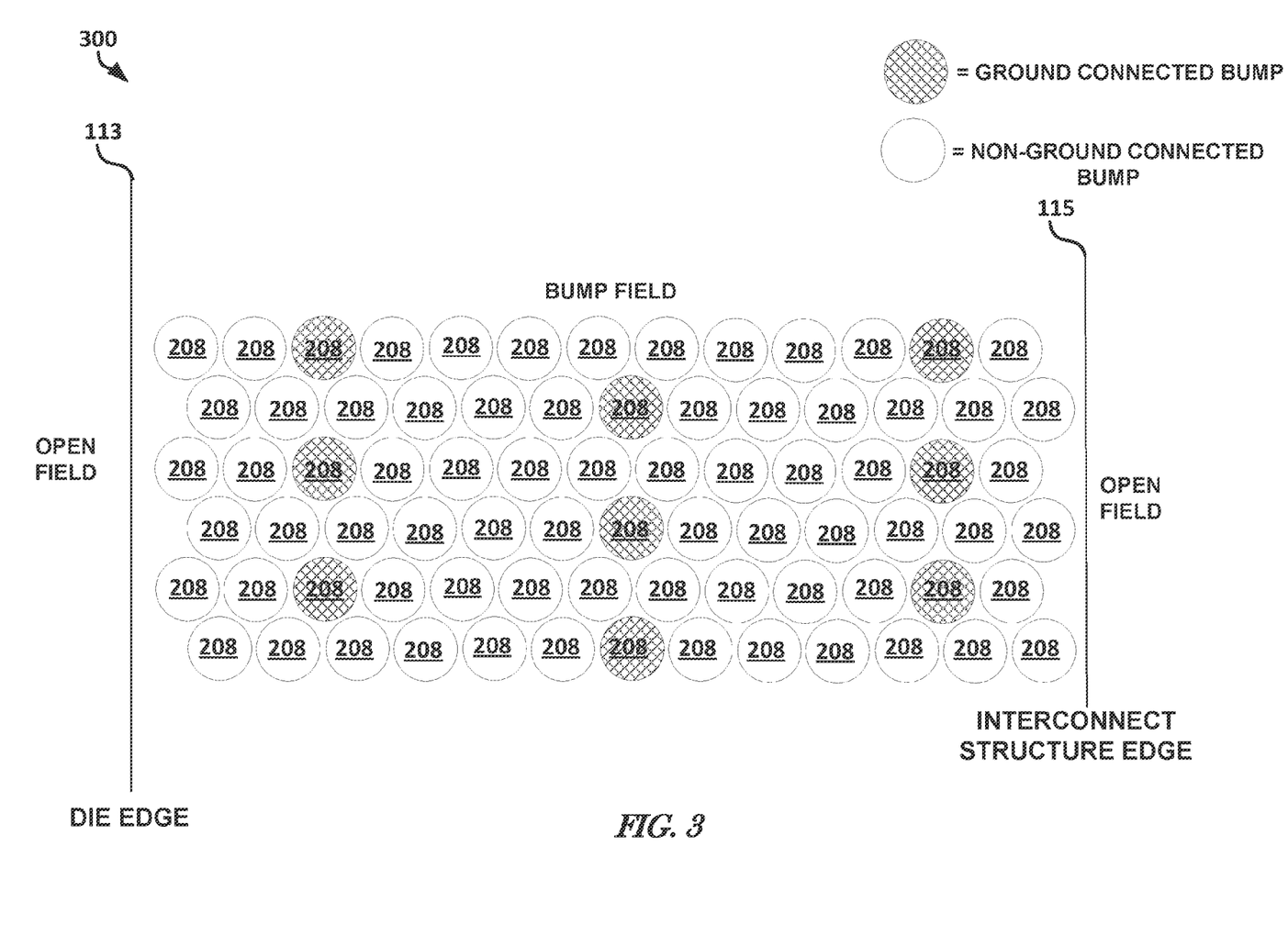
FIG. 3 illustrates, by way of example, a top view diagram of an embodiment of a bump field between a die edge and an interconnect structure edge.

A large number of ground bumps can suppress the bump-to-bump crosstalk, but can cause the die area to grow and increase the product cost. In one or more embodiments, a non-uniform placement of ground bumps can be used to achieve crosstalk suppression with fewer bumps. An example of a bump field that includes non-uniform ground bumps (bumps connected to ground) is illustrated in FIG. 3. FIG. 3 illustrates, by way of example, a top-view diagram of an embodiment of a portion of a system 300 that includes a bump field and an open field. The system 300 includes a 26-column bump field. Electrical studies have shown that the edge bumps (e.g., bumps most proximate to the interconnect structure edge 115 and the die edge 113) see higher crosstalk than the inner bumps (e.g., bumps with at least one other bump between it and the edge 115 and/or 113). Thus, more ground bumps can be placed close to the edge and fewer ground bumps may be needed in the inner field. In FIG. 3 the signal bumps near the die edge 113 see a local 4:1 signal-to-ground ratio, while the inner signal bumps observe a local 8:1 signal-to-ground ratio. The overall system 300 has about a global 8:1 (23:3) signal-to-ground ratio. Modeling has shown that the simulated worst case crosstalk is the same as a uniform 4:1 signal-to-ground design. However, the system 300 saves about 14% space over the uniform 4:1 signal-to-ground design. Note that the crosstalk can be further reduced by using a 3:1 signal-to-ground ratio on the edge, for example the signal bumps near the interconnect structure edge 115 realize such signal-to-ground ratio, and the inner bumps include a 6:1 signal-to-ground ratio. The actual implementation for a product will be a trade-off between bump count (space) and crosstalk level.

The trace-to-pad and trace-to-trace crosstalk can be managed by configuring wiring within the metal layers inside the bridge. Sometimes, layers M2 and M4 are used for signal routing, while layers M1 and M3 are employed for power or ground.

Figure 4:
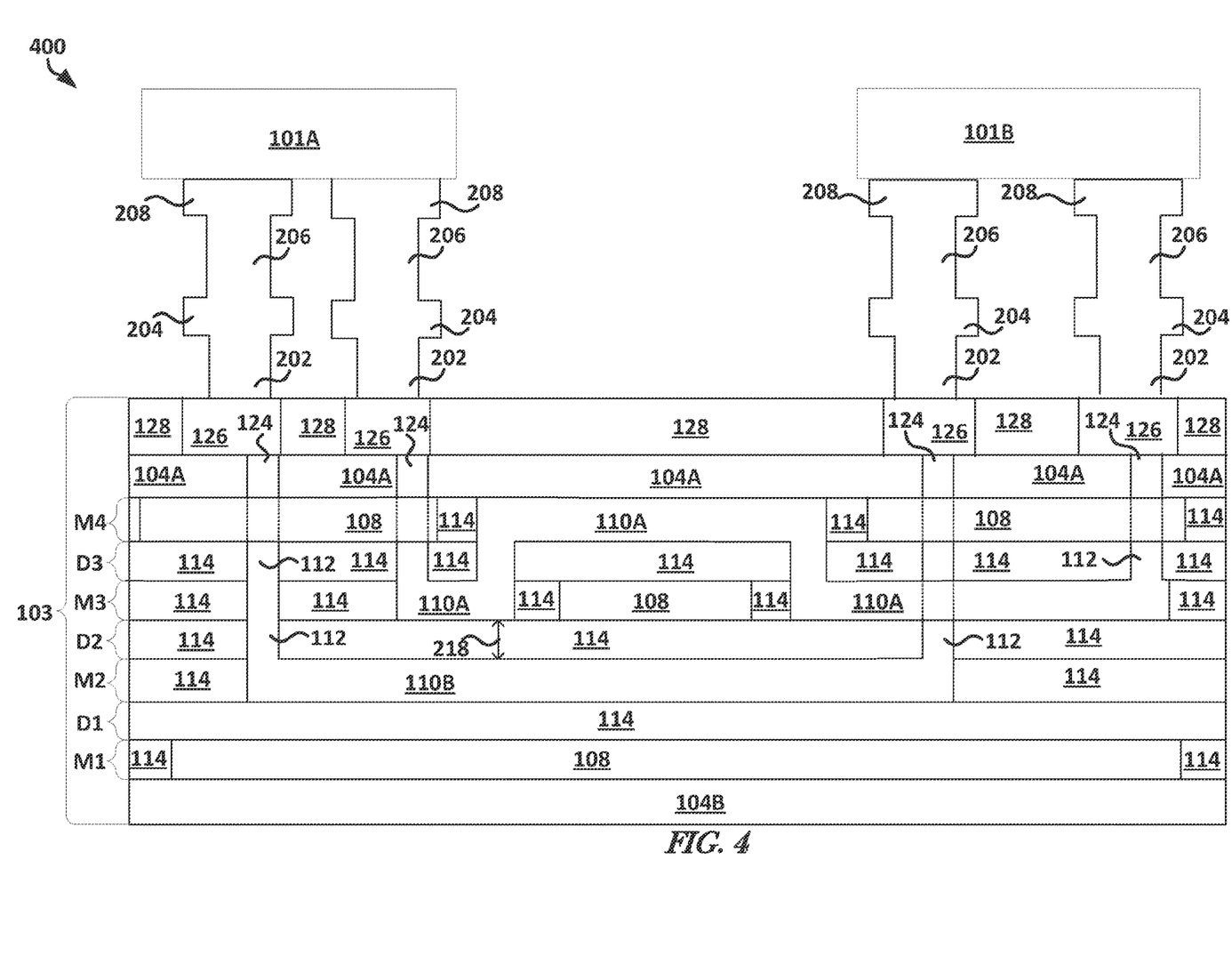
FIG. 4 illustrates, by way of example, a cross-section view diagram of an embodiment of another system that includes multiple communication channels communicating signals through a single interconnect structure.

FIG. 4 illustrates, by way of example, a cross-section diagram of an embodiment of a system 400 that is configured to reduce crosstalk as compared to previous interconnect structures. Generally, signals previously routed through M4 are routed through M3 within a footprint of the bump field and through M4 in the open field 402. M4, as illustrated, is devoid of signal traces within the footprint of the bump field. M1 as illustrated is devoid of signal traces. The bump field is the area within a footprint of the dies 10A-B and the open field 402 is the area outside of those footprints. By only including vias 112 and one or more ground planes (and no signal traces) in the bump field in the M4 layer, the trace-to-pad crosstalk can be reduced (e.g., eliminated). This trace-to-pad crosstalk can be significant at high speeds. However, such a change can increase trace-to-trace crosstalk. This can be, at least in part, because there is no ground plane isolating M4 and M2 signals in the bump field as there typically is in such interconnect structures. See the system 200 of FIG. 2 for an example of a system that includes the ground plane 108 isolating the M2 and M4 layer signals in the bump field.

Figure 5A:
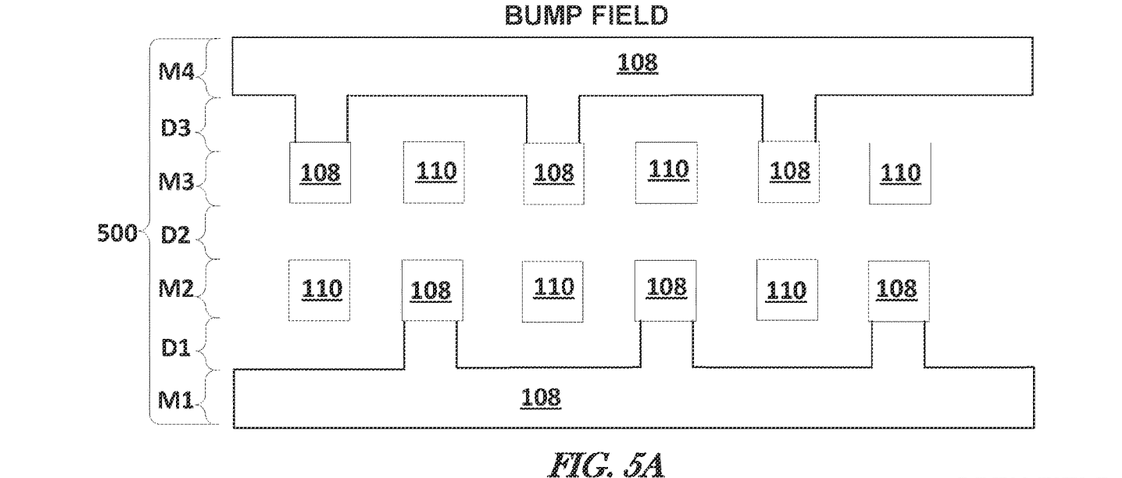
FIG. 5A illustrates, by way of example, a cross-section diagram of routing in a footprint of a bump field of an interconnect structure.
Figure 5B:
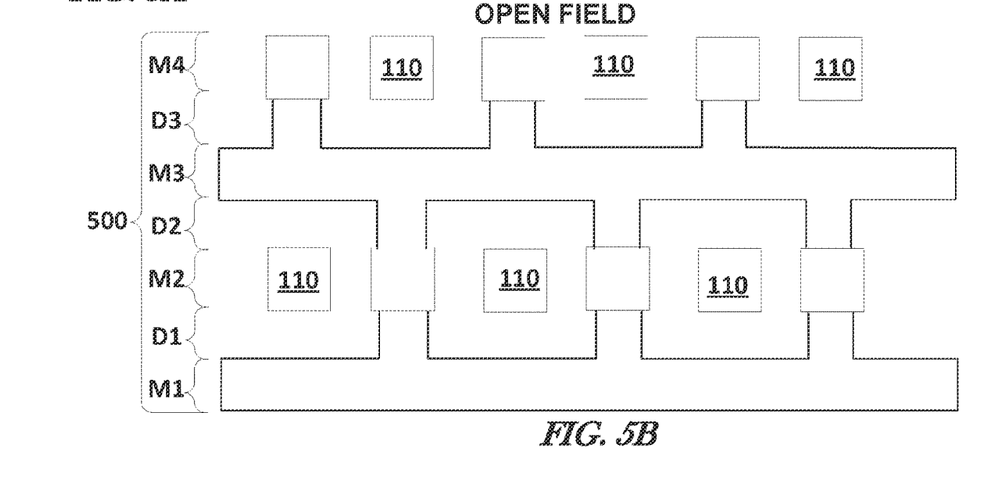
FIG. 5B illustrates, by way of example, a cross-section diagram of routing outside a footprint of the bump field (e.g., in an open field) of the interconnect structure of FIG. 5A.

FIG. 5A illustrates, by way of example, a cross-section diagram of an embodiment of routing in a stack 500 in a footprint of a bump field of an interconnect structure. FIG. 5B illustrates, by way of example, a cross-section diagram of an embodiment of routing in the stack 500 outside a footprint of the bump field (e.g., in an open field) of the interconnect structure of FIG. 5A. The stack 500 includes a one-to-one signal-to-ground ratio. Signal traces 110 in the M3 layer are offset from signal traces in the M2 layer such that signal traces in the M2 layer are directly under ground traces 108 in the M3 layer. This design effectively enlarges the cross-layer signal-to-signal distance and helps in reducing the corresponding trace-to-trace crosstalk.

Figure 6A:
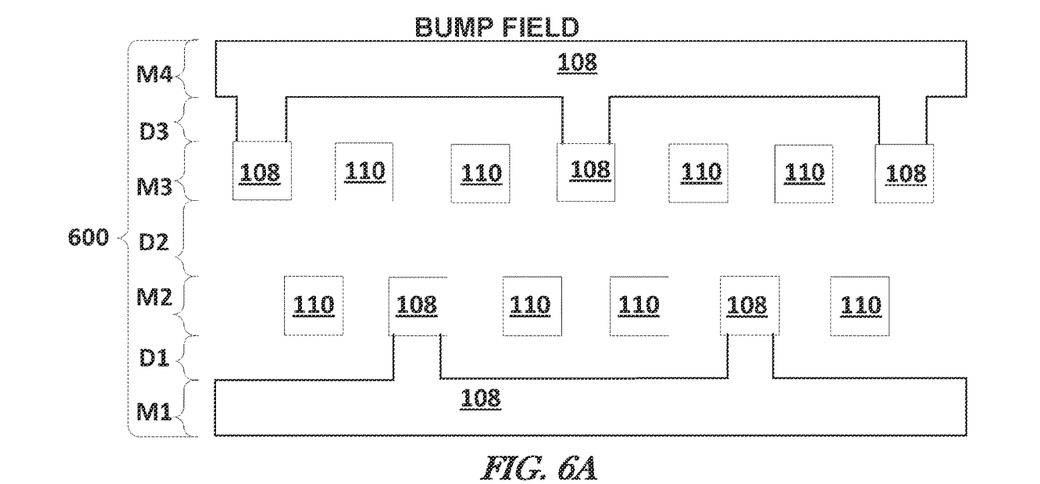
FIG. 6A illustrates, by way of example, a cross-section diagram of routing in a footprint of a bump field of another interconnect structure.
Figure 6B:
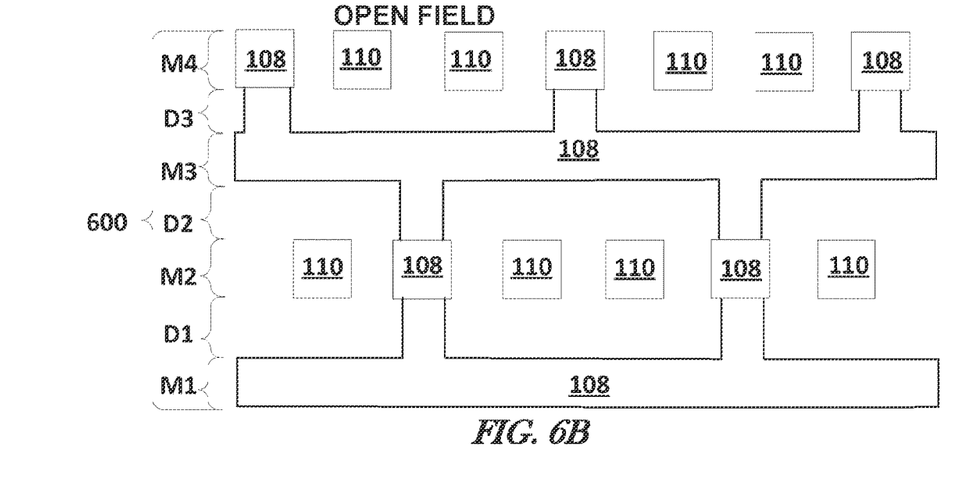
FIG. 6B illustrates, by way of example, a cross-section diagram of routing outside a footprint of the bump field (e.g., in an open field) of the interconnect structure of FIG. 6A.

FIG. 6A illustrates, by way of example, a cross-section diagram of an embodiment of routing in a stack 600 in a footprint of a bump field of an interconnect structure. FIG. 6B illustrates, by way of example, a cross-section diagram of an embodiment of routing in the stack 600 outside a footprint of the bump field (e.g., in an open field) of the interconnect structure of FIG. 6A. The stack 600 includes about a two-to-one signal-to-ground ratio. Signal traces 110 in the M3 layer are offset from signal traces in the M2 layer such that signal traces in the M2 layer are not directly under signal traces 110 in the M3 layer, such as to increase a distance between signal traces 110 (as compared to including signal traces 110 in the M2 layer directly under respective signal traces in the M3 layer). As a result, this signal offset across adjacent layers almost completely avoids the crosstalk increase caused by including signal routing in the M3 and M2 layers within the footprint of the bump field.

As used herein "low density" and "high density" are to be understood relative to one another. Low density means that it includes routing that is less dense than a corresponding high density. For example, a low density buildup layer includes routing (conductive interconnect material) that is less dense than routing in a high density buildup layer. In one or more embodiments, high density routing is up to about one hundred times denser than low density routing.

Figure 7:
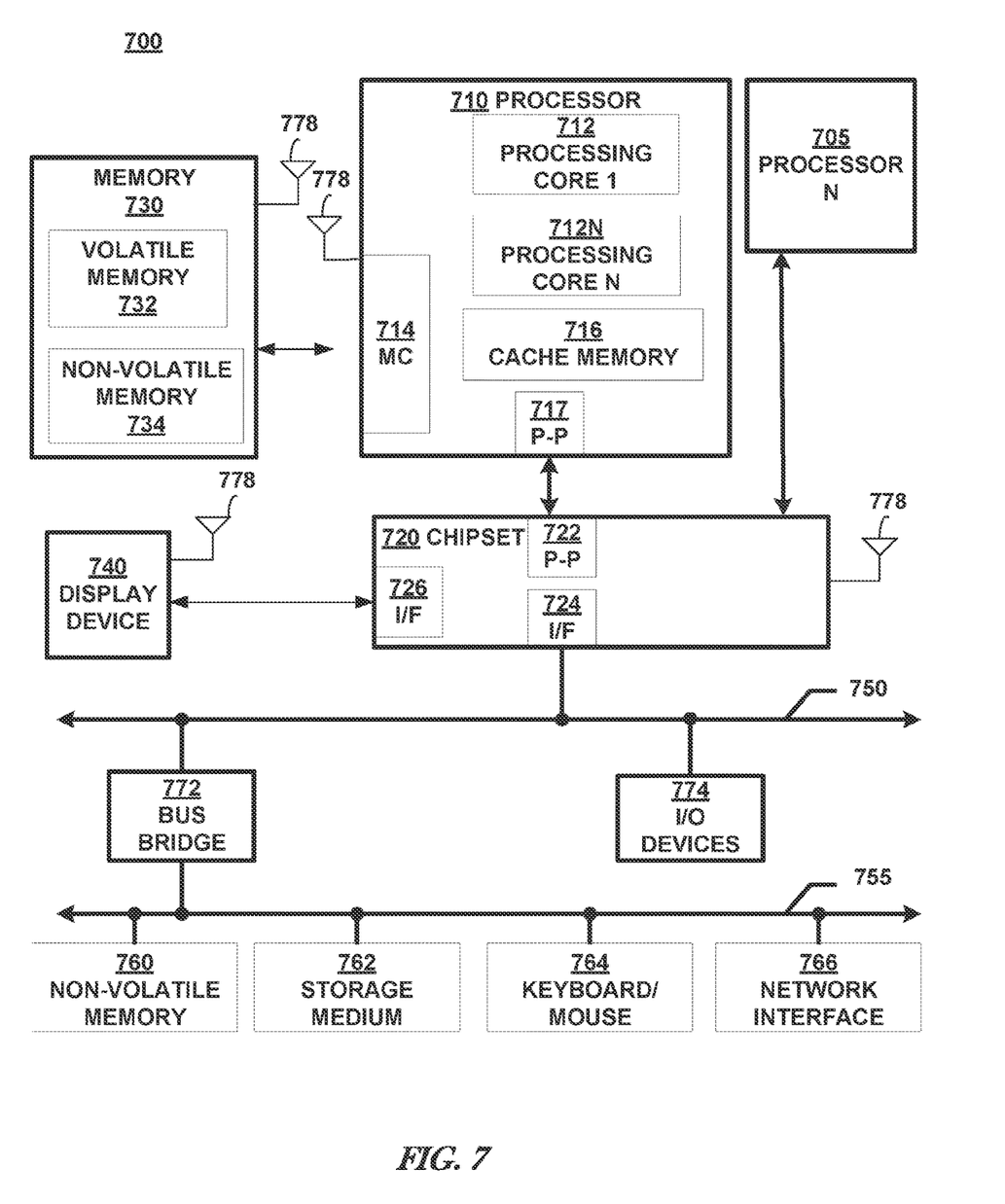
FIG. 7 is a schematic of an example of an electronic system in which a device as discussed herein can be used.

FIG. 7 illustrates, by way of example, a logical block diagram of an embodiment of system 700. In one or more embodiments, system 700 includes one or more components that can include the system 100 and/or 200, non-uniform ground bump placement as discussed with regard to FIG. 3, the system 400, the interconnect structure 103, and/or the stack 500 or 600 as discussed herein.

In one or more embodiments, processor 710 has one or more processing cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, the wireless antenna interface 778 operates in accordance with, but is not limited to, the IEEE 802.11 standard and its related family, Home Plug AV (HPAV). Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the invention, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices. Chipset 720 may also be coupled to a wireless antenna 778 to communicate with any device configured to transmit and/or receive wireless signals.

Chipset 720 connects to display device 740 via interface 726. Display 740 may be, for example, a liquid crystal display (LCD), a plasma display, cathode ray tube (CRT) display, or any other form of visual display device. In some embodiments of the invention, processor 710 and chipset 720 are merged into a single SOC. In addition, chipset 720 connects to one or more buses 750 and 755 that interconnect various elements 774, 760, 762, 764, and 766. Buses 750 and 755 may be interconnected together via a bus bridge 772. In one embodiment, chipset 720 couples with a non-volatile memory 760, a mass storage device(s) 762, a keyboard/mouse 764, and a network interface 766 via interface 724 and/or 704, etc.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family. Home Plug AV (HPAV), Ultra Wide Band (UWB), Bluetooth, WiMax, or any form of wireless communication protocol.

While the components shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

EXAMPLES AND NOTES

The present subject matter may be described by way of several examples.

Example 1 can include a system comprising a substrate including first routing therein at a first routing density, an interconnect structure embedded, at least partially, in the substrate, the interconnect structure including second routing therein at a second routing density, the first routing density less than the second routing density, a first die electrically connected to the first routing, and a second die electrically connected to the first routing and electrically connected to the first die through the second routing, the interconnect structure comprising alternating metal and dielectric layers including a first metal layer, second metal layer, and a third metal layer, the first metal layer closer to the first and second dies than the second and third metal layers, the first metal layer including a ground plane and vias within a footprint of a bump field of the interconnect structure and signal traces outside the footprint of the bump field.

In Example 2, Example 1 can further include, wherein the second metal layer is between the first and third metal layers and wherein the second metal layer includes a ground plane outside the footprint of the bump field and includes traces within the footprint of the bump field.

In Example 3, at least one of Examples 1-2 can further include, wherein the first metal layer is devoid of traces within the footprint of the bump field.

In Example 4, at least one of Examples 1-3 can further include, wherein the third metal layer includes a ground plane within the footprint of the bump field and includes traces outside the footprint of the bump field.

In Example 5, at least one of Examples 1-4 can further include, wherein the first metal layer includes alternating ground and signal traces outside the footprint of the bump field such that the signal trace to ground trace ratio in the first metal layer and outside the footprint of the bump field is one to one.

In Example 6, at least one of Examples 1-5 can further include, wherein the third metal layer includes alternating ground and signal traces outside the footprint of the bump field such that the signal trace to ground trace ratio in the third metal layer and outside the footprint of the bump field is one to one.

In Example 7, at least one of Examples 1-6 can further include, wherein the signal traces outside the footprint of the bump field in the third metal layer are offset from the signal traces outside the footprint of the bump field in the first metal layer so as to not be directly underneath the signal traces outside the footprint of the bump field in the first metal layer.

In Example 8, at least one of Examples 1-7 can further include, wherein the second metal layer includes alternating ground and signal traces inside the footprint of the bump field and under the ground plane such that the signal trace to ground trace ratio in the second metal layer and inside the footprint of the bump field is one to one.

In Example 9, at least one of Examples 1-4 can further include, wherein the first metal layer includes two signal traces for each ground trace in the first metal layer.

In Example 10, at least one of Examples 1-4 and 9 can further include, wherein, outside the footprint of the bump field, the third metal layer includes two signal traces for each ground trace.

In Example 11, at least one of Examples 1-4 and 9-10 can further include, wherein the signal traces outside the footprint of the bump field in the third metal layer are offset from the signal traces outside the footprint of the bump field in the first metal layer so as to not be directly underneath the signal traces outside the footprint of the bump field in the first metal layer.

In Example 12, at least one of Examples 1-4 and 9-11 can further include, wherein, inside the footprint of the bump field, the second metal layer includes two signal traces for each ground trace.

In Example 13, at least one of Examples 1-12 can further include, wherein the interconnect structure further comprises a fourth metal layer under the third metal layer, the fourth metal layer including a ground plane.

In Example 14, at least one of Examples 1-13 can further include, wherein the bump field comprises bumps electrically connecting the first and second dies to a respective pad of the interconnect structure, wherein the bumps connected to ground in the bump field are non-uniformly distributed.

In Example 15, at least one of Examples 1-14 can further include, wherein bumps situated most proximate a die edge include a lower signal bump to ground bump ratio than bumps in the bump field situated further away from the die edge.

Example 16 can include an interconnect structure comprising a first metal layer, a second metal layer, a third metal layer, the first metal layer closer to the first and second dies than the second and third metal layers, the first metal layer including a ground plane within a footprint of a bump field of the interconnect structure and signal traces outside the footprint of the bump field.

In Example 17, Example 16 can further include, wherein the second metal layer is between the first and third metal layers and wherein the second metal layer includes a ground plane outside the footprint of the bump field and includes traces within the footprint of the bump field.

In Example 18, at least one of Examples 16-17 can further include, wherein the first metal layer is devoid of traces within the footprint of the bump field.

In Example 19, at least one of Examples 16-18 can further include, wherein the third metal layer includes a ground plane within the footprint of the bump field and includes traces outside the footprint of the bump field.

In Example 20, at least one of Examples 16-19 can further include, wherein the first metal layer includes alternating ground and signal traces outside the footprint of the bump field such that the signal trace to ground trace ratio in the first metal layer and outside the footprint of the bump field is one to one.

In Example 21, at least one of Examples 16-20 can further include, wherein the third metal layer includes alternating ground and signal traces outside the footprint of the bump field such that the signal trace to ground trace ratio in the third metal layer and outside the footprint of the bump field is one to one.

In Example 22, at least one of Examples 16-21 can further include, wherein the signal traces outside the footprint of the bump field in the third metal layer are offset from the signal traces outside the footprint of the bump field in the first metal layer so as to not be directly underneath the signal traces outside the footprint of the bump field in the first metal layer.

In Example 23, at least one of Examples 16-22 can further include, wherein the second metal layer includes alternating ground and signal traces inside the footprint of the bump field and under the ground plane such that the signal trace to ground trace ratio in the second metal layer and inside the footprint of the bump field is one to one.

In Example 24, at least one of Examples 16-18 can further include, wherein the first metal layer includes two signal traces for each ground trace in the first metal layer.

In Example 25, at least one of Examples 16-18 and 24 can further include, wherein, outside the footprint of the bump field, the third metal layer includes two signal traces for each ground trace.

In Example 26, at least one of Examples 16-18 and 24-25 can further include, wherein the signal traces outside the footprint of the bump field in the third metal layer are offset from the signal traces outside the footprint of the bump field in the first metal layer so as to not be directly underneath the signal traces outside the footprint of the bump field in the first metal layer.

In Example 27, at least one of Examples 16-18 and 24-26 can further include, wherein, inside the footprint of the bump field, the second metal layer includes two signal traces for each ground trace.

Example 28 can include a system comprising a substrate including first routing therein at a first routing density, an interconnect structure embedded, at least partially, in the substrate, the interconnect structure including second routing therein at a second routing density, the first routing density less than the second routing density, a bump field including respective bumps electrically connected to respective pads of the interconnect structure, a first die electrically connected to the first routing and electrically connected to the second die through the second routing and one or more of the bumps, and a second die electrically connected to the first routing and electrically connected to the second routing, the interconnect structure comprising alternating metal and dielectric layers including a first metal layer, a second metal layer, a third metal layer, and a fourth metal layer, a first dielectric layer between the first and second metal layers, a second dielectric layer between the second and third metal layers, and a third dielectric layer between the third and fourth metal layers, the first metal layer closer to the first and second dies than the second and third metal layers, the first and third metal layers including a ground plane within a footprint of a bump field of the system and signal traces outside the footprint of the bump field, and the second metal layer including a ground plane outside the footprint of the bump field and includes traces within the footprint of the bump field.

In Example 29, Example 28 can further include, wherein the bumps connected to ground in the bump field are non-uniformly distributed such that bumps situated most proximate a die edge include a lower signal bump to ground bump ratio than bumps in the bump field situated further away from the die edge.

In Example 30, at least one of Examples 28-29 can further include, wherein the first metal layer is devoid of traces within the footprint of the bump field.

In Example 31, at least one of Examples 28-30 can further include, wherein the first metal layer includes alternating ground and signal traces outside the footprint of the bump field such that the signal trace to ground trace ratio in the first metal layer and outside the footprint of the bump field is one to one.

In Example 32, at least one of Examples 28-31 can further include, wherein the third metal layer includes alternating ground and signal traces outside the footprint of the bump field such that the signal trace to ground trace ratio in the third metal layer and outside the footprint of the bump field is one to one.

In Example 33, at least one of Examples 28-32 can further include, wherein the signal traces outside the footprint of the bump field in the third metal layer are offset from the signal traces outside the footprint of the bump field in the first metal layer so as to not be directly underneath the signal traces outside the footprint of the bump field in the first metal layer.

In Example 34, at least one of Examples 28-33 can further include, wherein the second metal layer includes alternating ground and signal traces inside the footprint of the bump field and under the ground plane such that the signal trace to ground trace ratio in the second metal layer and inside the footprint of the bump field is one to one.

In Example 35, at least one of Examples 28-30 can further include, wherein the first metal layer includes two signal traces for each ground trace in the first metal layer.

In Example 36, at least one of Examples 28-30 and 35 can further include, wherein, outside the footprint of the bump field, the third metal layer includes two signal traces for each ground trace.

In Example 37, at least one of Examples 28-30 and 35-36 can further include, wherein the signal traces outside the footprint of the bump field in the third metal layer are offset from the signal traces outside the footprint of the bump field in the first metal layer so as to not be directly underneath the signal traces outside the footprint of the bump field in the first metal layer.

In Example 38, at least one of Examples 28-30 and 35-37 can further include, wherein, inside the footprint of the bump field, the second metal layer includes two signal traces for each ground trace.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A" and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A semiconductor device package, comprising:
a substrate including first routing;
an interconnect structure die on or at least partially in the substrate, the interconnect structure die including second routing;
a first die electrically connected to the first routing; and a second die electrically connected to the first routing and electrically connected to the first die through the second routing, wherein the interconnect structure die includes:
a region comprising a plurality of bumps, and
first, second, and third metal layers, wherein the first metal layer is closer to the first and second dies than the second and third metal layers, the second metal layer is between the first and third metal layers and includes a ground plane outside a footprint of the region and includes traces within the footprint of the region, the first metal layer includes a ground plane within the footprint of the region and signal traces outside the footprint of the region, the third metal layer includes a ground plane within the footprint of the region and includes traces outside the footprint of the region and the first metal layer includes two signal traces for an individual ground trace in the first metal layer.

2. The semiconductor device package of claim 1, wherein the first metal layer is devoid of traces within the footprint of the region.

3. The semiconductor device package of claim 1, wherein the first metal layer includes alternating ground and signal traces outside the footprint of the region such that a signal trace to ground trace ratio in the first metal layer and outside the footprint of the region is one to one.

4. The semiconductor device package of claim 3, wherein the third metal layer includes alternating ground and signal traces outside the footprint of the region such that a signal trace to ground trace ratio in the third metal layer and outside the footprint of the region is one to one.

5. The semiconductor device package of claim 4, wherein the signal traces outside the footprint of the region in the third metal layer are offset from the signal traces outside the footprint of the region in the first metal layer.

6. The semiconductor device package of claim 5, wherein the second metal layer includes alternating ground and signal traces inside the footprint of the region and under the ground plane of the third metal layer.

7. The semiconductor device package of claim 6, wherein a signal trace to ground trace ratio in the second metal layer and inside the footprint of the region is one to one.

8. The semiconductor device package of claim 4, wherein the signal traces outside the footprint of the region in the third metal layer are not directly underneath the signal traces outside the footprint of the region in the first metal layer.

9. The semiconductor device package of claim 1, wherein the traces outside the footprint of the region in the third metal layer are offset from the signal traces outside the footprint of the region in the first metal layer.

10. The semiconductor device package of claim 9, wherein, inside the footprint of the region, the second metal layer includes two signal traces for an individual ground trace.

11. The semiconductor device package of claim 1, wherein signal traces outside the footprint of the region in the third metal layer are not directly underneath the signal traces outside the footprint of the region in the first metal layer.

12. An interconnect structure die, comprising:
a field of conductive bumps;
a first metal layer;
a second metal layer; and
a third metal layer,
wherein the first metal layer includes a ground plane and vias within a footprint of the field and signal traces outside the footprint of the field, the second metal layer is between the first and third metal layers and includes a ground plane outside the footprint of the field and includes traces within the footprint of the field, the third metal layer includes alternating ground and signal traces outside the footprint of the field, and a signal trace to ground trace ratio in the third metal layer and outside the footprint of the bump field is one to one.

13. The interconnect structure die of claim 12, wherein the first metal layer is devoid of traces within the footprint of the field.

14. The interconnect structure die of claim 13, wherein the third metal layer includes a ground plane within the footprint of the field and includes traces outside the footprint of the field.

15. The interconnect structure die of claim 13, wherein the first metal layer includes alternating ground and signal traces outside the footprint of the field, and wherein a signal trace to ground trace ratio in the first metal layer and outside the footprint of the field is one to one.

16. An interconnect structure die, comprising:
a plurality of conductive bumps;
a first metal layer, a second metal layer, a third metal layer, and a fourth metal layer;
a first dielectric layer between the first and second metal layers;
a second dielectric layer between the second and third metal layers; and
a third dielectric layer between the third and fourth metal layers,
wherein:
the first and third metal layers include a ground plane within a footprint of the plurality of conductive bumps and signal traces outside the footprint of the plurality of conductive bumps,
the first metal layer includes two signal traces for an individual ground trace in the first metal layer, and
the second metal layer is between the first and third metal layers and includes a ground plane outside the footprint of the plurality of conductive bumps and includes signal traces within the footprint of the plurality of conductive bumps.

17. The interconnect structure die of claim 16, wherein a first subset of conductive bumps of the plurality of conductive bumps has a lower signal bump to ground bump ratio than a second subset of conductive bumps of the plurality of conductive bumps.

18. The interconnect structure die of claim 17, wherein the first subset includes conductive bumps of the plurality of conductive bumps that are most proximate an edge of a die coupled to the interconnect structure die, and the second subset includes conductive bumps of the plurality of conductive bumps that are situated further away from the edge than the conductive bumps of the first subset.

19. The interconnect structure die of claim 16, wherein the first metal layer is devoid of traces within the footprint of the plurality of conductive bumps.

20. The interconnect structure die of claim 16, wherein ground conductive bumps of the plurality of conductive bumps are non-uniformly distributed.

* * * * *

UNITED STATES PATENT AND TRADEMARK OFFICE
CERTIFICATE OF CORRECTION

PATENT NO. : 11,923,308 B2
APPLICATION NO. : 17/114954
DATED : March 5, 2024
INVENTOR(S) : Zhiguo Qian et al.

It is certified that error appears in the above-identified patent and that said Letters Patent is hereby corrected as shown below:

On the Title Page

Below item (56), under "Assistant Examiner", in Column 2, Line 1, delete "Mikka Liu" and insert -- Mikka H Liu --.

In the Claims

In Column 14, Claim 12, Line 11, delete "bump field" and insert -- field --, therefor.

In Column 14, Claim 18, Line 53, delete "proximate an" and insert -- proximate to an --, therefor.

Signed and Sealed this
Twentieth Day of August, 2024

Katherine Kelly Vidal
*Director of the United States Patent and Trademark Office*